(12) United States Patent
Lu et al.

(10) Patent No.: US 7,843,684 B2
(45) Date of Patent: Nov. 30, 2010

(54) WATERPROOF AND HEAT-DISSIPATING MODULE MOUNTED FOR AN ELECTRONIC DEVICE

(75) Inventors: Yi-Jen Lu, Yilan County (TW); Shu-Hsien Lin, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 29 days.

(21) Appl. No.: 12/428,477

(22) Filed: Apr. 23, 2009

(65) Prior Publication Data

US 2010/0195282 A1    Aug. 5, 2010

(30) Foreign Application Priority Data

Feb. 5, 2009    (CN)    .................... 2009 1 0037122

(51) Int. Cl.
*H05K 7/20*    (2006.01)
(52) U.S. Cl. ............................. 361/679.47; 361/679.48; 361/679.49; 361/690; 361/692; 361/695; 165/104.33; 165/104.34; 165/122; 165/185; 174/17 R; 174/50; 174/547
(58) Field of Classification Search ................................
361/679.46–679.51, 690–696, 714, 715, 361/724–728, 818, 831; 174/17 R, 17 VA, 174/50, 252, 254, 547; 165/121, 122, 185, 165/104.33, 104.34; 312/223.2, 223.3, 236
See application file for complete search history.

(56) References Cited

U.S. PATENT DOCUMENTS

| | | | | |
|---|---|---|---|---|
| 5,502,618 A * | 3/1996 | Chiou | ........................ | 361/695 |
| 5,707,757 A * | 1/1998 | Lee | .............................. | 429/86 |
| 5,943,220 A * | 8/1999 | Shikata et al. | .............. | 361/818 |
| 6,081,425 A * | 6/2000 | Cheng | ......................... | 361/704 |
| 7,289,320 B2 * | 10/2007 | Chang et al. | ................. | 361/690 |
| 7,436,661 B2 * | 10/2008 | Fong et al. | ................... | 361/695 |
| 7,679,906 B2 * | 3/2010 | Fong et al. | ................... | 361/695 |
| 7,733,647 B2 * | 6/2010 | Lee | .............................. | 361/690 |
| 2008/0101041 A1 * | 5/2008 | Chang et al. | ................. | 361/728 |

* cited by examiner

*Primary Examiner*—Michael V Datskovskiy
(74) *Attorney, Agent, or Firm*—Kile Goekjian Reed & McManus PLLC (57) ABSTRACT

A waterproof and heat-dissipating module mounted on an electronic device includes a housing structure, a compartment structure, and a fan. A first ventilation hole, a second ventilation hole, a first drainage holes, and a second drainage holes are formed on the housing structure. The compartment structure is disposed inside the housing structure and for partitioning an inside space of the housing structure off that includes an inhaling chamber, a fan room, an accommodated space, and an exhausting chamber. The fan is disposed inside the fan room so that airflow is guided from the first ventilation hole to the second ventilation hole via the inhaling chamber, the fan room, the accommodated space, and the exhausting chamber so as to dissipate heat from circuit boards disposed inside the accommodated space away.

12 Claims, 10 Drawing Sheets

WATERPROOF AND HEAT-DISSIPATING MODULE MOUNTED FOR AN ELECTRONIC DEVICE

BACKGROUND OF THE INVENTION

1. Field of the Invention

The present invention relates to a heat-dissipating module, and more particularly, to a waterproof and heat-dissipating module mounted for an electronic device.

2. Description of the Prior Art

With a trend of light weight, volume of an electronic device is reduced correspondingly, such as a power adaptor and a power supply. However, the smaller electronic device has a problem of heat dissipation. For example, electronic elements on a circuit board produce heat when the power adaptor is operating. A housing of the conventional power adaptor is usually made of plastic material. Heat efficiency of the plastic material is worse so that the heat accumulates inside the hosing of the power adaptor easily. The electronic elements of the power adaptor often damages due to the heat-dissipating problem so that it not only decreases service life of the power adaptor but also reduces operating efficiency of the power adaptor.

There is a power adaptor with heat-dissipating structure capable of solving the problem of heat dissipation in the market presently. In order to dissipate the heat generated from the electronic elements, a plurality of thermal fins is disposed on the circuit board, and the electronic elements and the plurality of thermal fins are connected to each other with screws or rivets for improving efficiency of the heat dissipation. However, new-type power adaptor is developed as smaller size and higher power so that the conventional heat-dissipating mechanism is unsatisfied.

A mechanism of forced convection needs to form openings on the housing of the power adaptor so as to guide airflow to flow there through and applies a fan to improve the efficiency of the heat dissipation. However, when the power adaptor operates in a humid surrounding, the inner electronic elements may be damaged by mist flowing through the openings on the housing. If there are liquids pouring into the power adaptor accidentally, the inner electronic elements will be damaged or cause short immediately.

In order to prevent the liquids pouring into the electronic device by the mechanism of forced convection, a slab can be disposed between the electronic elements and airflow channels. Therefore, the airflow guided by the airflow channels can dissipate the heat transmitted from the electronic device to the slab. However, airflow from outside does not flow over the electronic elements directly so that the efficiency of heat dissipation is limited.

SUMMARY OF THE INVENTION

According to the claimed invention, a waterproof and heat-dissipating module includes a housing structure, whereon a first ventilation hole, a second ventilation hole, a first drainage hole, and a second drainage hole are formed, and a compartment structure disposed inside the housing structure for partitioning an inside space of the housing structure. The compartment structure includes an inhaling chamber including an inhaling chamber bottom disposed relative to the first drainage hole, and an inhaling chamber neck having an inlet misaligned with the first ventilation hole. The compartment structure further includes a fan room, an accommodated space for accommodating a circuit board, and an exhausting chamber including an exhausting chamber bottom disposed relative to the second drainage hole, an exhausting chamber neck having an outlet, and a waterproof slab disposed between the exhausting chamber neck and the second ventilation hole for separating the outlet of the exhausting chamber neck and the second ventilation hole. The waterproof and heat-dissipating module further includes a fan disposed inside the fan room for guiding airflow to flow from the first ventilation hole to the second ventilation hole via the inhaling chamber, the fan room, the accommodated space, and the exhausting chamber.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
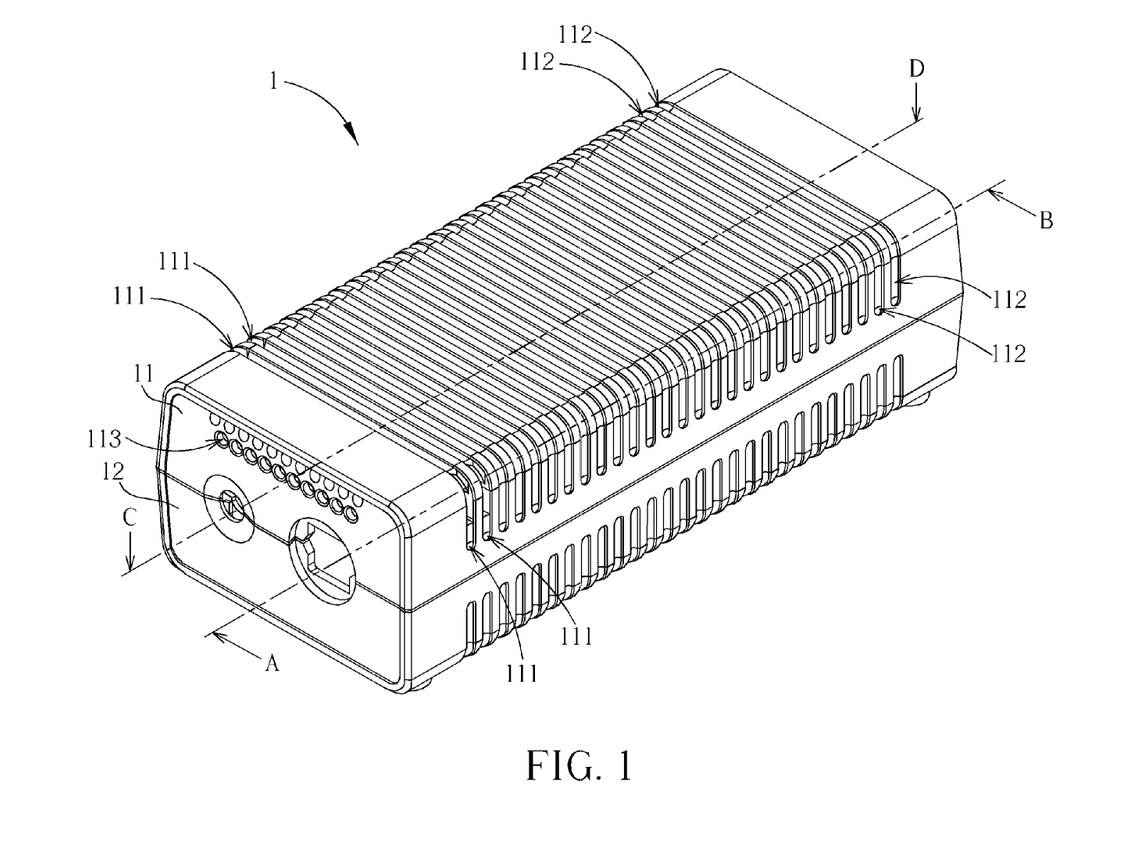
FIG. 1 is a diagram of a waterproof and heat-dissipating module mounted on an electronic device of the present invention.
Figure 2:
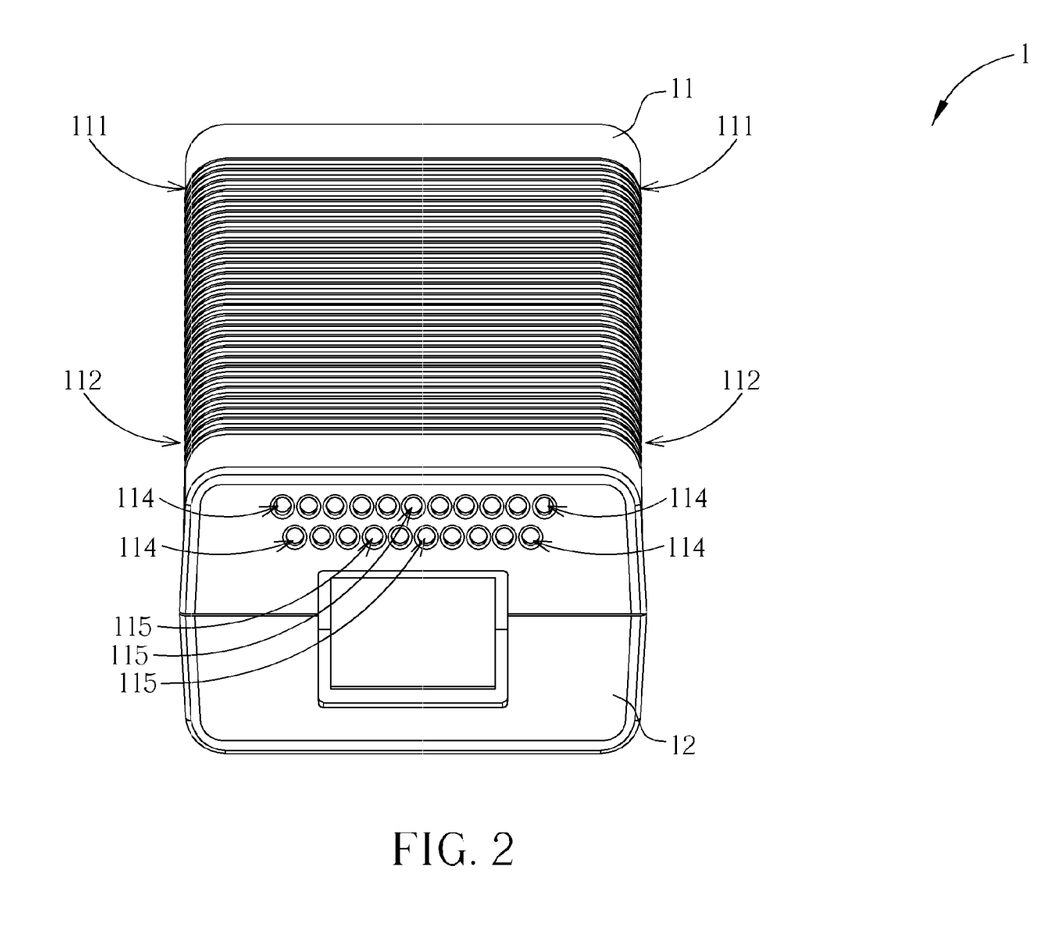
FIG. 2 is a diagram of the waterproof and heat-dissipating module mounted on the electronic device in another view of the present invention.
Figure 3:
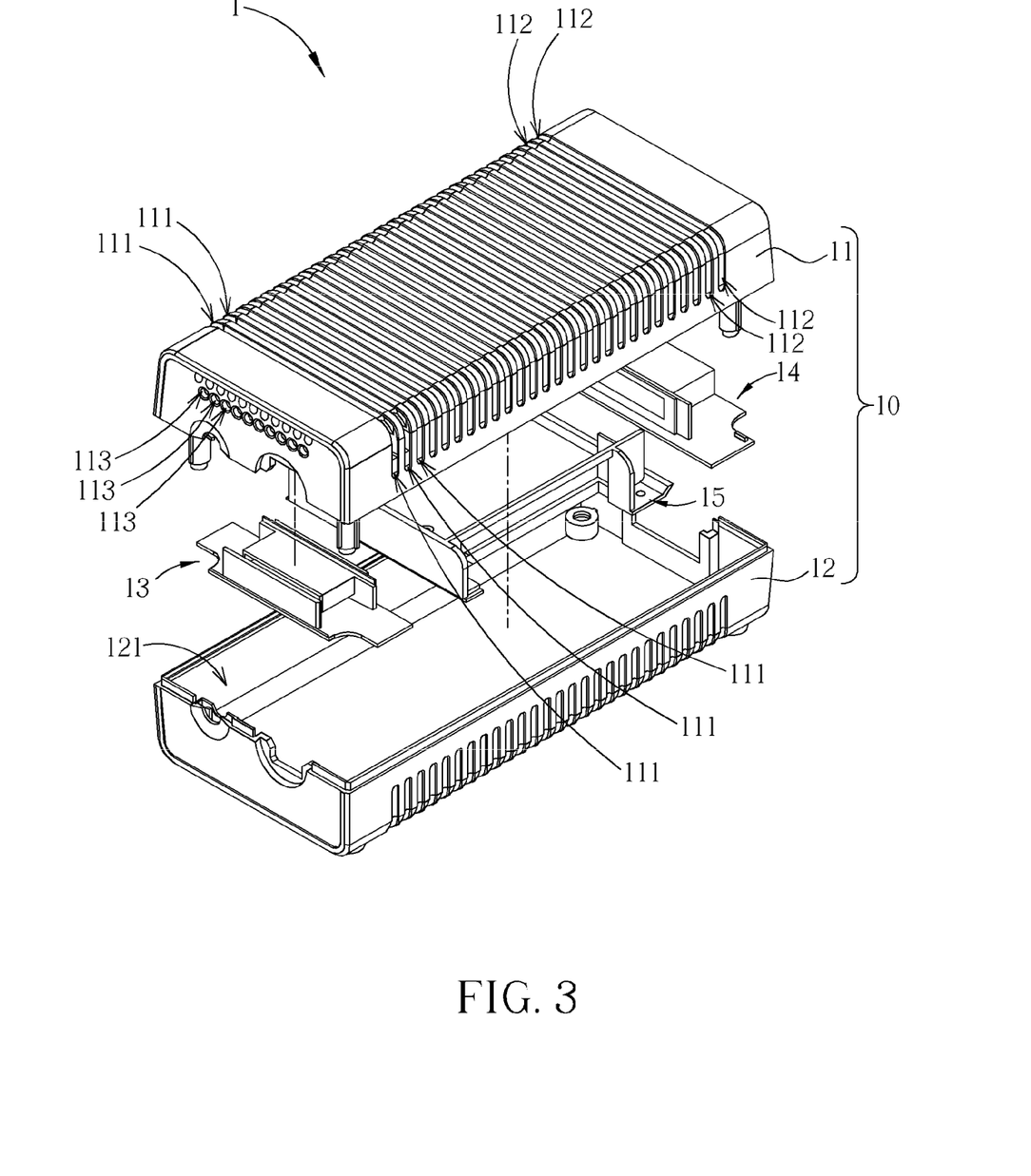
FIG. 3 is an exploded diagram of the waterproof and heat-dissipating module mounted on the electronic device of the present invention.
Figure 4:
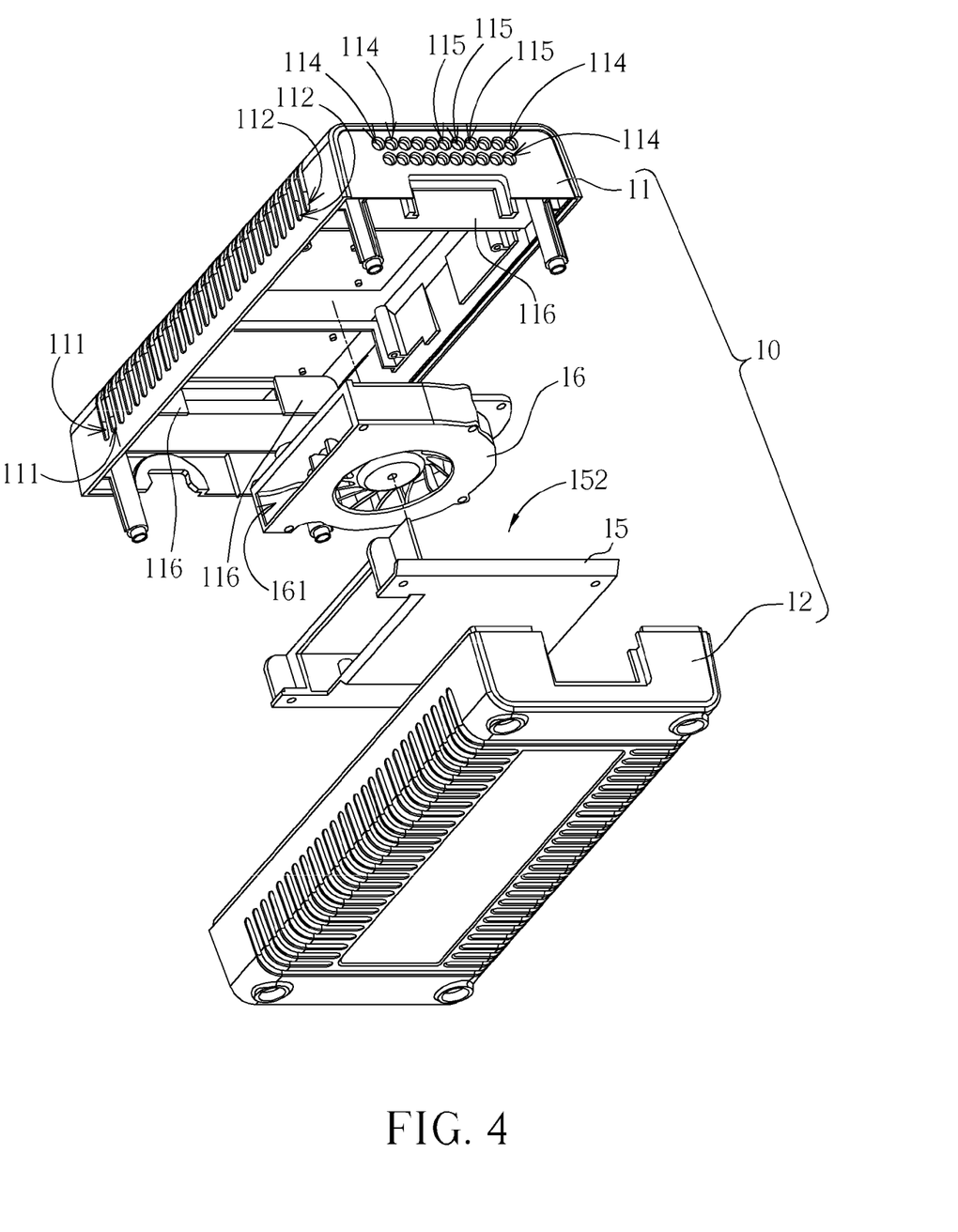
FIG. 4 is an exploded diagram of the waterproof and heat-dissipating module mounted on the electronic device in another view of the present invention.

Please refer to FIG. 1 to FIG. 4. FIG. 1 is a diagram of a waterproof and heat-dissipating module 1 mounted for an electronic device of the present invention. FIG. 2 is a diagram of the waterproof and heat-dissipating module 1 in another view of the present invention. FIG. 3 is an exploded diagram of the waterproof and heat-dissipating module 1 of the present invention. FIG. 4 is an exploded diagram of the waterproof and heat-dissipating module 1 in another view of the present invention.

Figure 5:
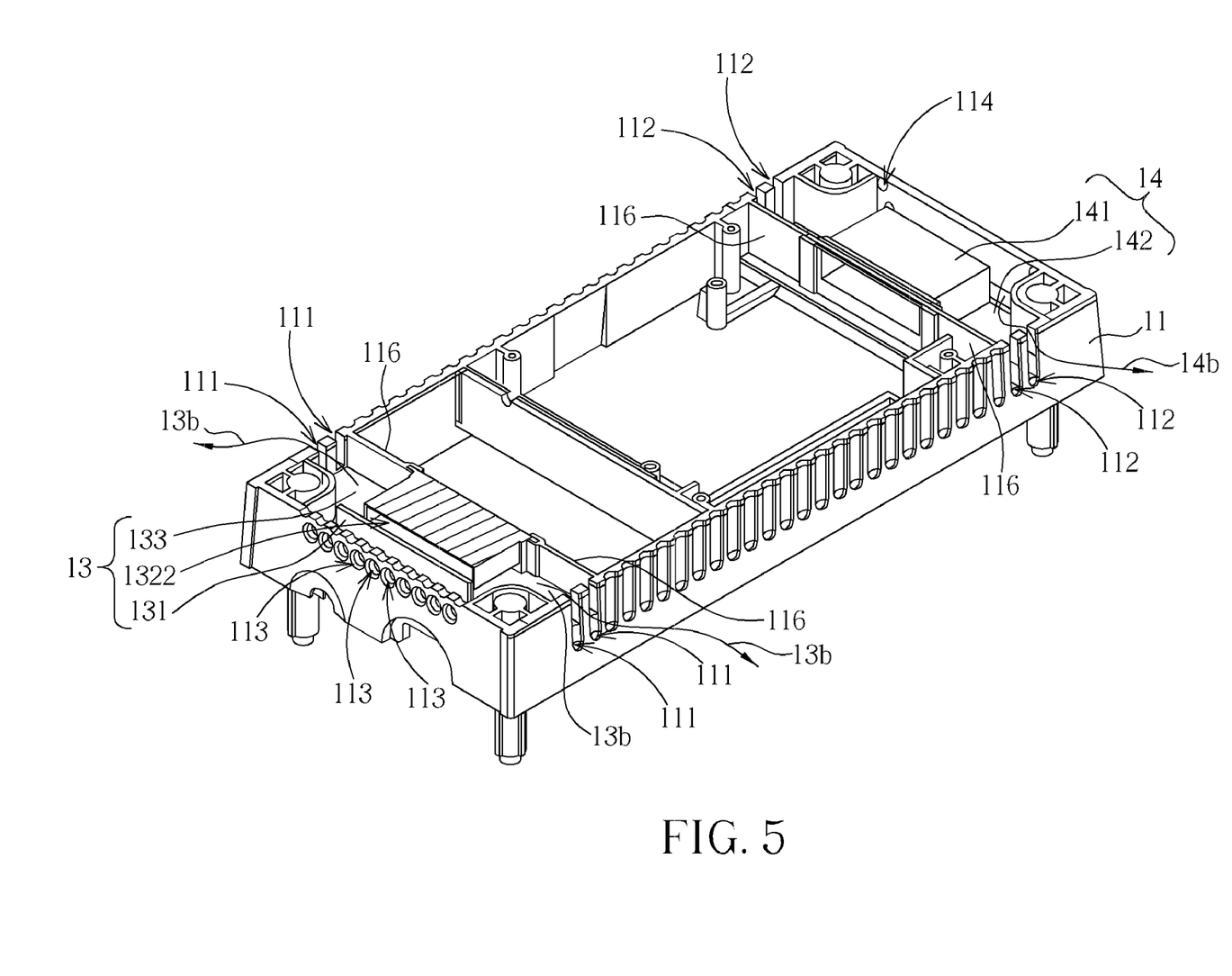
FIG. 5 is a cross-section along the line A-B in FIG. 1 of an upper housing of the waterproof and heat-dissipating module without a fan of the present invention.
Figure 6:
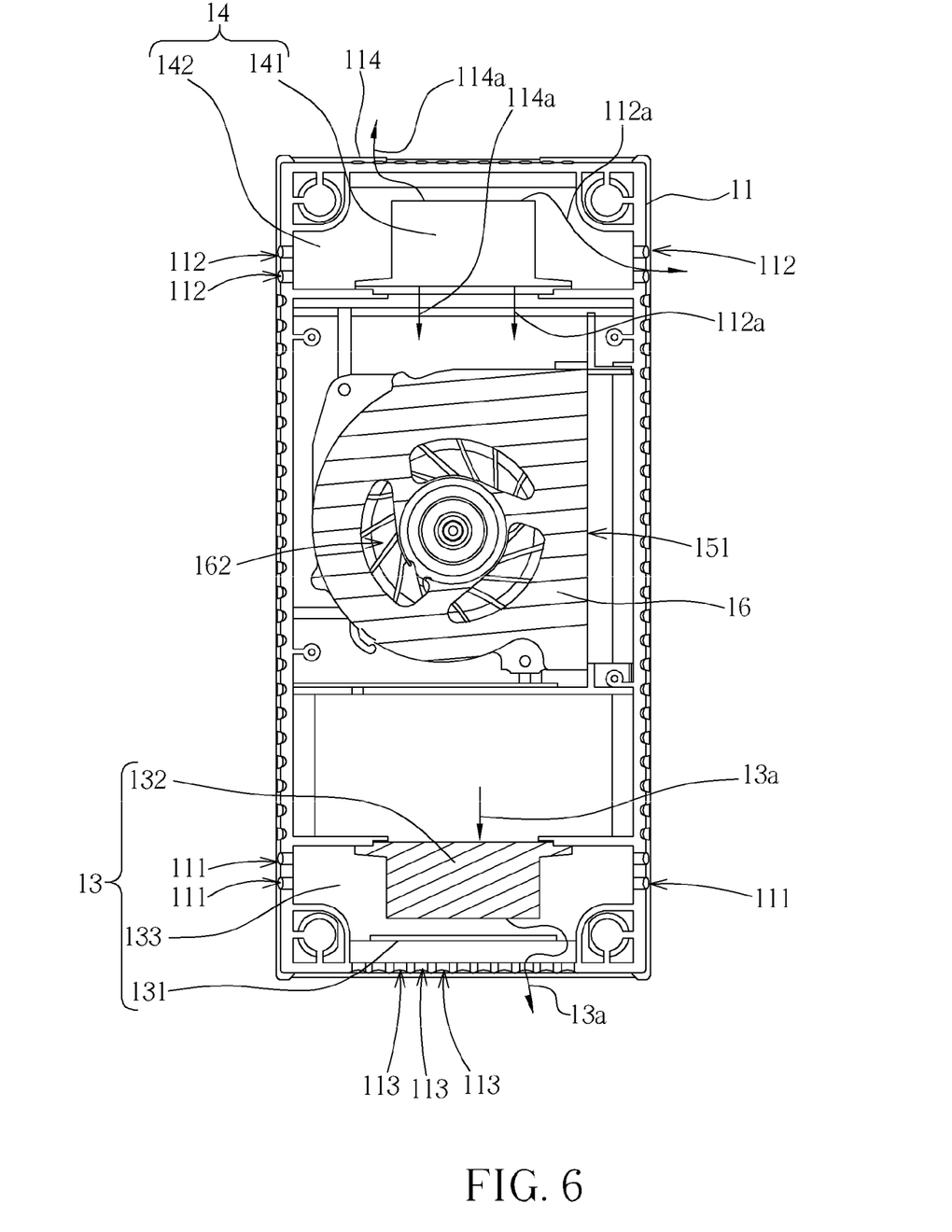
FIG. 6 is a cross-section along the line A-B in FIG. 1 of the upper housing of the waterproof and heat-dissipating module with the fan of the present invention.
Figure 7:
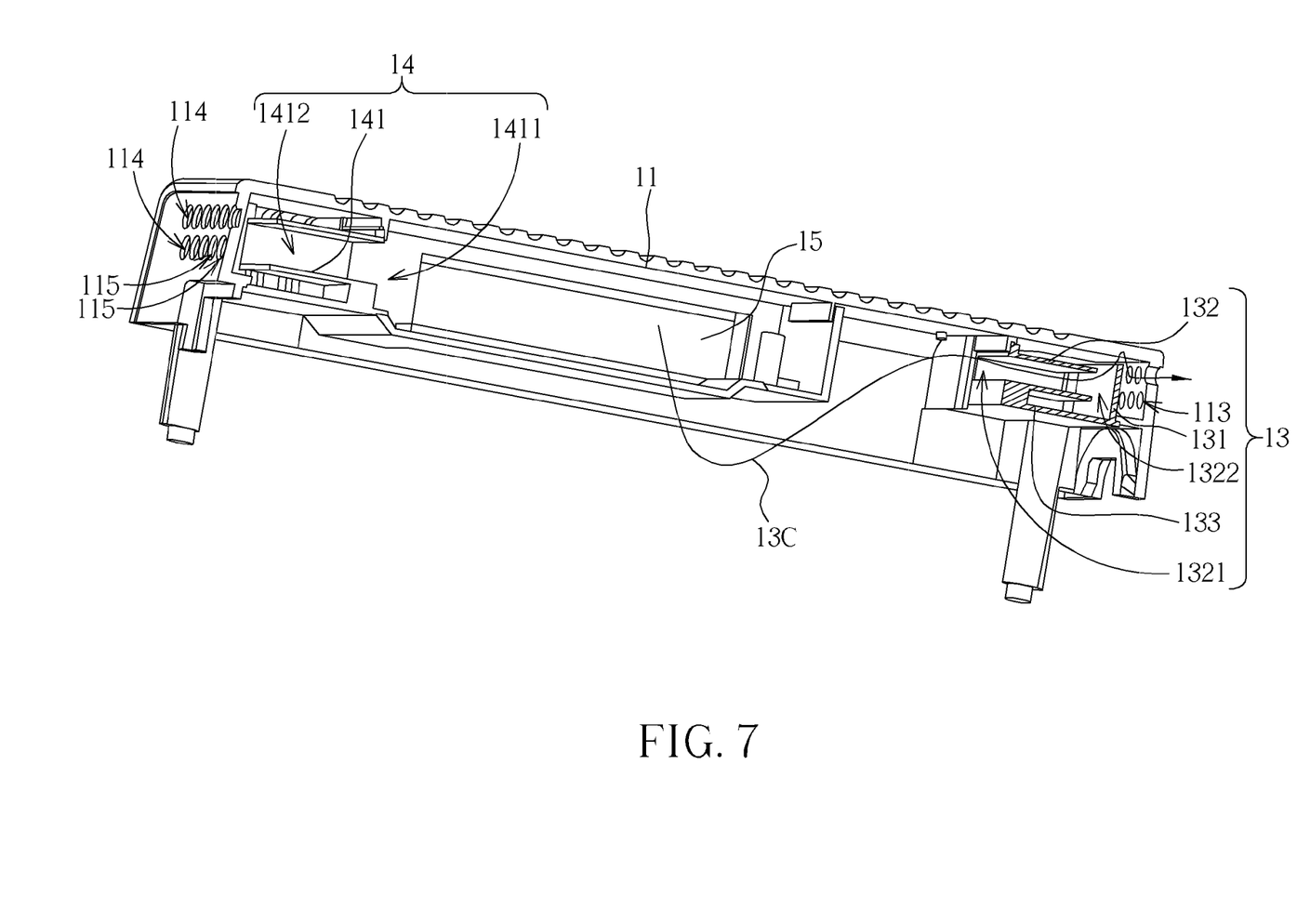
FIG. 7 is a cross-section along the line C-D in FIG. 1 of the upper housing of the waterproof and heat-dissipating module of the present invention.

The waterproof and heat-dissipating module 1 mounted for the electronic device includes a housing structure 10, a compartment structure 116 disposed inside the housing structure 10, and a fan 16 disposed inside the housing structure 10. The housing structure 10 includes an upper housing 11 and a lower housing 12 engaging to each other tightly. Please refer to FIG. 5, FIG. 6, and FIG. 7. FIG. 5 is a cross-section along the line A-B in FIG. 1 of the upper housing 11 of the waterproof and heat-dissipating module 1 without the fan 16 of the present invention. For clear description, FIG. 5 shows inner space in the upper housing 11 without the fan 16. FIG. 6 is a cross-section along the line A-B in FIG. 1 of the upper housing 11 of the waterproof and heat-dissipating module 1 with the fan 16 of the present invention. FIG. 6 shows the fan 16 instead of the inner space in FIG. 5. FIG. 7 is a cross-section along the line C-D in FIG. 1 of the upper housing 11 of the waterproof and heat-dissipating module 1 of the present invention.

As shown in FIG. 1 and FIG. 2, in order to guide airflow to flow into and out of the housing structure 10, a first ventilation hole 114 and second ventilation hole 113 are formed on the upper housing 11. With the fan 16 working, the airflow can flow from the first ventilation hole 114 to the second ventilation hole 113 via electronic elements inside the housing structure 10 capable of producing heat. In order to drain out water condensed from mist, a first drainage hole 112 and a second drainage hole 111 are formed adjacent to the first ventilation hole 114 and the second ventilation hole 113 on lateral sides of the upper housing 11, respectively.

In order to prevent additional water inhaled into the housing structure 10 by the fan 16, an amount of the first ventilation hole 114 can be less than an amount of the second ventilation hole 113 for decreasing inhaling water. As shown in FIG. 7, an inlet 1412 of an inhaling chamber neck 141 is misaligned with the first ventilation hole 114 for preventing the water from flowing over the electronic elements in the housing structure 10 via the inhaling chamber neck 141 directly.

As shown in FIG. 3 and FIG. 4, the compartment structure 116 disposed inside the housing structure 10 can separate the inner space inside the housing structure 10 into an inhaling chamber 14, a fan room 15, an accommodated space 121, and an exhausting chamber 13, which are connected with one another. The fan 16 is disposed inside the fan room 15 so as to guide the airflow flowing from the first ventilation hole 114 and the first drainage hole 112 to the second ventilation hole 113 and the second drainage hole 111. As shown an arrow 13c in FIG. 7, the airflow flows over the inhaling chamber 14, the fan room 15, the accommodated space 121, and the exhausting chamber 13 sequentially for dissipating the heat from a circuit board disposed inside the accommodated space 121 so as to prevent decrease service life and efficiency of the electronic device.

In order to prevent the water being inhaled into the accommodated space 121 directly, the amounts of the first ventilation hole 114 and the second ventilation hole 113 formed on the lateral sides of the upper housing 11 are not equal, but a plurality of blind holes 115 can be formed on the upper housing 11 shown in FIG. 2 for aesthetic feeling and symmetry, so that an arrangement and the amount of the first ventilation hole 114 and the plurality of blind holes 115 are the same as an arrangement and the amount of the second ventilation hole 113. In other words, the plurality of blind holes 115 is aligned with the inlet 1412 of the inhaling chamber neck 141, and the first ventilation hole 114 is formed on both sides of the plurality of blind holes 115 shown in FIG. 2.

The inhaling chamber 14, the fan room 15, and the exhausting chamber 13 can be formed on the upper housing 11, the accommodated space 121 can be formed on the lower housing 12, and the fan room 15 can be formed between the inhaling chamber 14 and the exhausting chamber 13. The inhaling chamber 14, the fan room 15, and the exhausting chamber 13 are substantially parallel to the accommodated space 121. The airflow can flow from the inhaling chamber 14 to the exhausting chamber 13 via the fan room 15 and the accommodated space 121. As shown in FIG. 4, the fan room 15 includes an inlet 152 and an outlet 151. The inlet 152 is connected to a top inlet 162 of the fan 16 shown in FIG. 6 and an outlet 1411 of the inhaling chamber neck 141 shown in FIG. 7, and the outlet 151 is connected to a lateral outlet 161 of the fan 16 and the accommodated space 121. The first ventilation hole 114 is formed on the inhaling chamber 14 of the upper housing 11, and the second ventilation hole 113 is formed on the exhausting chamber 13 of the upper housing 11.

The fan 16 disposed on the fan room 15 can guide the airflow to flow into the accommodated space 121 via the first ventilation hole 114 and the inhaling chamber 14 along direction 114a, and flowing out via the exhausting chamber 13 and the second ventilation hole 113 along direction 13a shown in FIG. 6. During this process, when the airflow is inhaled into the accommodated space 121 by the fan 16, the airflow takes the heat from the circuit board disposed on the accommodated space 121, then flows out of the accommodated space 121 to the exhausting chamber 13 along direction 13b, and finally flows out of the waterproof and heat-dissipating structure 1 mounted on the electronic device of the present invention shown in FIG. 5.

In addition, the airflow driven by the fan 16 can be inhaled into the inhaling chamber 14 via the first drainage hole 112 along direction 112a shown in FIG. 6, and also can be exhausted out of the exhausting chamber 13 via the second drainage hole 111.

Figure 8:
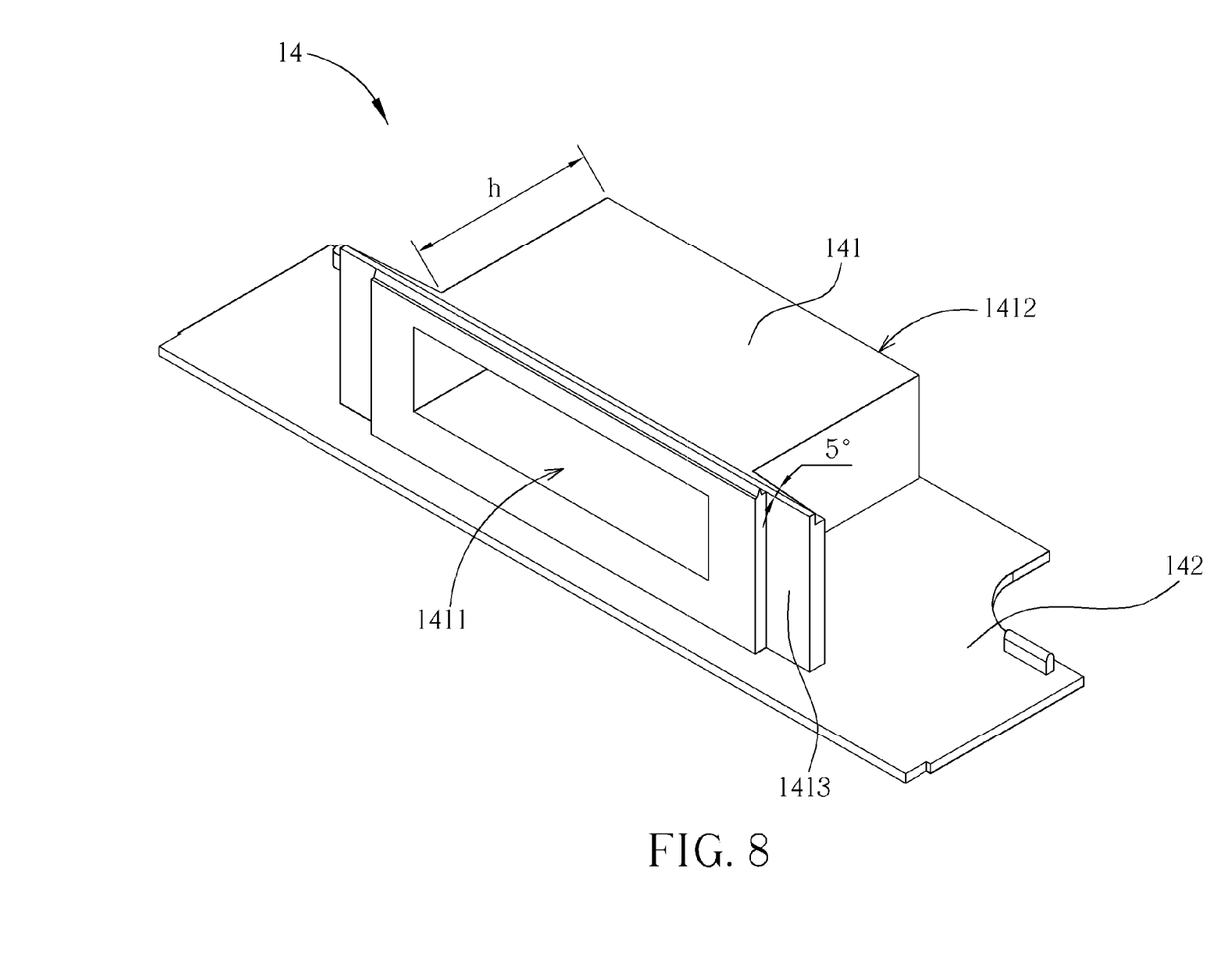
FIG. 8 is a diagram of an inhaling chamber of the present invention.
Figure 9:
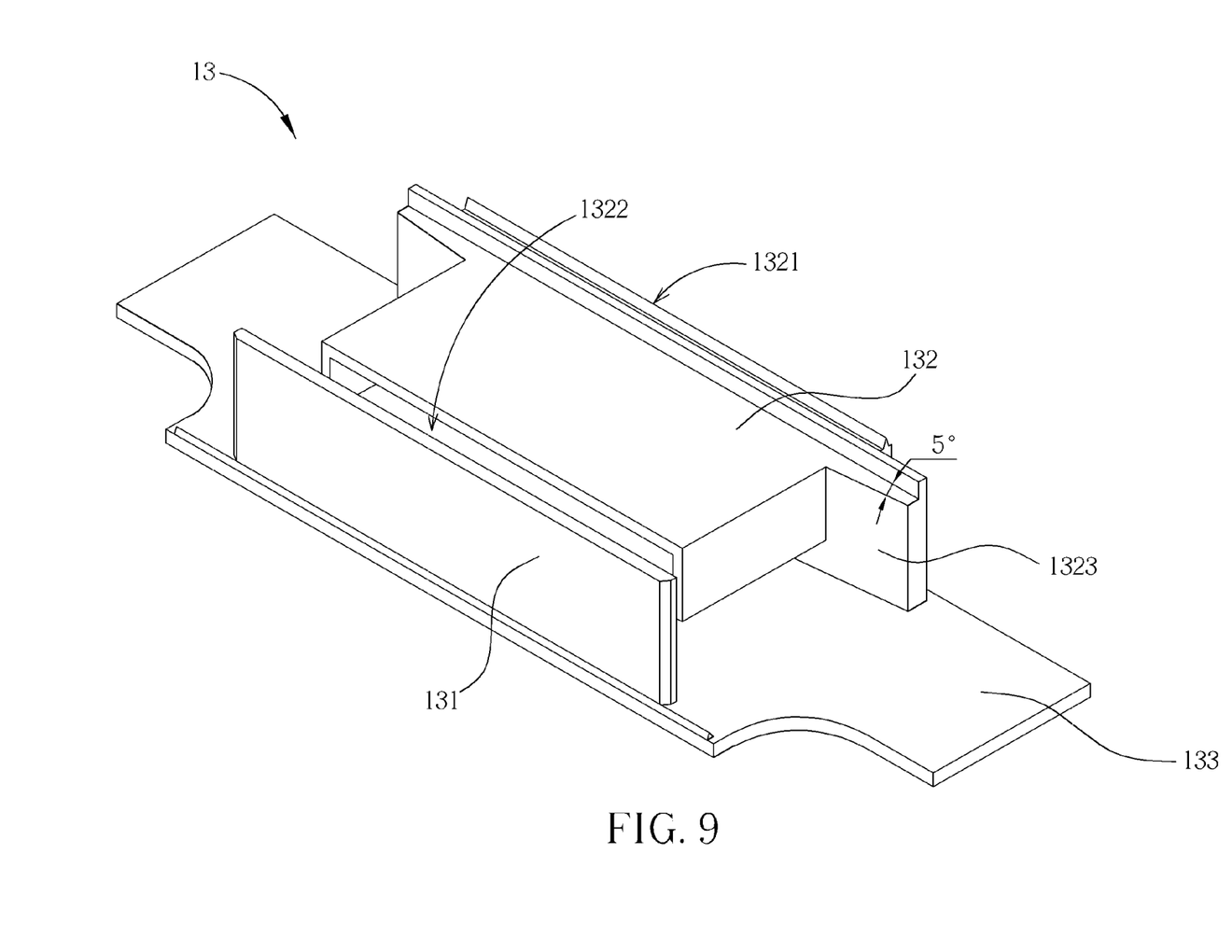
FIG. 9 is a diagram of an exhausting chamber of the present invention.
Figure 10:
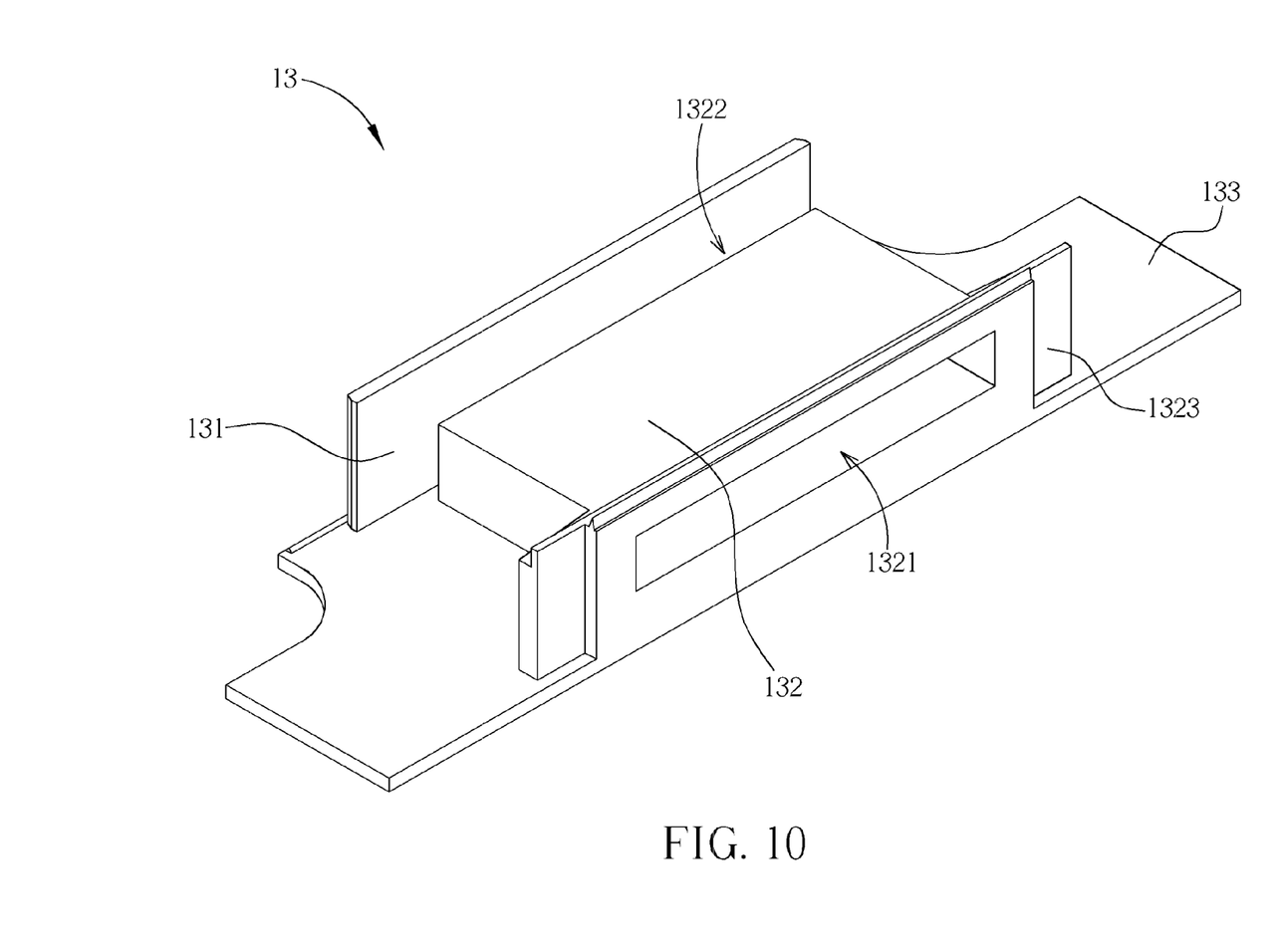
FIG. 10 is a diagram of the exhausting chamber in another view of the present invention.

Please refer to FIG. 8, FIG. 9, and FIG. 10. FIG. 8 is a diagram of the inhaling chamber 14 of the present invention. FIG. 9 is a diagram of the exhausting chamber 13 of the present invention. FIG. 10 is a diagram of the exhausting chamber 13 in another view of the present invention. As shown in FIG. 8, the inhaling chamber 14 includes an inhaling chamber bottom 142 and the inhaling chamber neck 141. The inhaling chamber bottom 142 is disposed relative to the first drainage hole 112, and the inlet 1412 of the inhaling chamber neck 141 is misaligned with the first ventilation hole 114. As shown in FIG. 9 and FIG. 10, the exhausting chamber 13 includes an exhausting chamber bottom 133, an exhausting chamber neck 132, and a slab 131. The slab 131 is disposed between an outlet 1322 of the exhausting chamber neck 132 and the second ventilation hole 113.

In order to avoid the water condensed from the mist being guided into the housing structure 10 via the first ventilation hole 114, even to avoid liquids from being poured into the first ventilation hole 114 and the second ventilation hole 113 directly, the slab 131 and the bottom slabs (including the inhaling chamber bottom 142 and the exhausting chamber bottom 133) inclined relative to the first drainage hole 112 and the second drainage hole 111 need to be disposed inside the inhaling chamber 14 and the exhausting chamber 13 respectively for guiding the liquids draining out via the first drainage hole 112 and the second drainage hole 111 and preventing the electronic elements being damaged.

As shown in FIG. 5 and FIG. 6, the inlet 1412 of the inhaling chamber neck 141 is misaligned with the first ventilation hole 114. Therefore, the airflow driven by the fan 16 can be guided into the fan room 15 via the first ventilation hole 114 and the inlet 1412 of the inhaling chamber neck 141 of the inhaling chamber 14 along direction 114a shown in FIG. 6. When the airflow flows from the first ventilation hole 114 to the inhaling chamber neck 141, the airflow turns along direction 114a. At this way, air inhaling force of the fan 16 is proportioned to length of the inhaling chamber neck 141. The mist condenses on walls of the inhaling chamber 14 (especially on walls of the inhaling chamber neck 141), the inhaling chamber bottom 142, and inside walls of the upper housing 11 facing to the inhaling chamber 14, so that the inhaling chamber bottom 142 and the compartment structure 116 are disposed relative to the first drainage hole 112 for guiding the liquids and the water condensed from the mist to drain out via the first drainage hole 112 along direction 14b shown in FIG. 5 and for preventing the electronic device from being damaged by the water. In other words, the inhaling chamber bottom 142 is disposed relative to the first drainage hole 112 closely so that the water can drain out of the inhaling chamber 14 via the first drainage hole 112. When the mist condenses on walls of the exhausting chamber 13 (especially on walls of the exhausting chamber neck 132), the exhausting chamber bottom 133, and inside walls of the upper housing 11 facing to the exhausting chamber 13, the liquids and the water condensed from the mist can drain out via the second drainage hole 111 along direction 13b shown in FIG. 5 with the exhausting chamber bottom 133 and compartment structure 116 being disposed relative to the second drainage hole 111.

When the waterproof and heat-dissipating structure 1 is erected, for example, the first ventilation hole 114 faces upward and the second ventilation hole 113 faces to the ground, the length of the inhaling chamber neck 141 is determined according to a suction pressure generated by the fan 16 in the haling chamber 14. Gravity of the water should be larger than the suction pressure generated by the fan 16 so that the water can be drained out of the inhaling chamber 14. The formula is as following:

P1=Gravity of the water;

P2=Suction pressure generated by the fan 16;

If P1>P2, the water can be drained out.

$P1 = \rho g h$ (Pressure=Density*Acceleration of Gravity*Height)

$\rho = 1000$ Kg/m$^3$ (Density of Water)

$g = 9.81$ m/S$^2$ (Acceleration of Gravity)

Assumption: if P2 is 9.66 mm–Aq(measured value), h>9.66*9.81/(1000*9.81)=0.00966 m=9.66 mm.

Therefore, the length of the inhaling chamber neck 141 is proportioned to the air inhaling force of the fan 16. The air inhaling force of the fan 16 is affected by an inner structure of the waterproof and heat-dissipating module 1 and the suction pressure generated by the fan 16.

In order to drain out of the water effectively, when the waterproof and heat-dissipating structure 1 is erected, an inclined slab 1413 extended from the inhaling chamber neck 141 is disposed relative to the outlet 1411 of the inhaling chamber neck 141 as shown in FIG. 8. The water can be drained out of the first drainage hole 112 via the inclined slab 1413, the compartment structure 116, and the inhaling chamber bottom 142 along direction 14b. At the same way, an inclined slab 1323 extended from the exhausting chamber neck 132 is disposed relative to the inlet 1321 of the exhausting chamber neck 132 for draining the water out of the exhausting chamber 13, as shown in FIG. 9 and FIG. 10. The liquids can be drained out of the second drainage hole 111 via the inclined slab 1323, the compartment structure 116, and the exhausting chamber bottom 133.

In addition, in order to overcome surface tension and viscosity of the water, inclined angles of the inclined slab 1413 and the inclined slab 1323 are preferably 5 degrees for draining rapidly. An angle between an inclined surface of the inclined slab 1323, stretching from a side far from the exhausting chamber neck 132 to a side connecting with the exhausting chamber neck 132, and the compartment structure 116 is between 3 degrees and 30 degrees. Similarly, an angle between an inclined surface of the inclined slab 1413, stretching from a side far from the inhaling chamber neck 141 to a side connecting with the inhaling chamber neck 141, and the compartment structure 116 is between 3 degrees and 30 degrees. In order to prevent the water from entering the exhausting chamber neck 132, the area size of the slab 131 must be larger than the size of the exhausting chamber neck 132.

Those skilled in the art will readily observe that numerous modifications and alterations of the device and method may be made while retaining the teachings of the invention.

What is claimed is:

1. A waterproof and heat-dissipating structure comprising:
   a housing structure, with a first ventilation hole, a second ventilation hole, a first drainage hole, and a second drainage hole being formed on the housing structure;
   a compartment structure disposed inside and partitioning an inside space of the housing structure, the compartment structure comprising:
      an inhaling chamber comprising:
         an inhaling chamber bottom disposed relative to the first drainage hole; and
         an inhaling chamber neck having an inlet misaligned with the first ventilation hole;
      a fan room;
      an accommodated space for accommodating a circuit board; and
      an exhausting chamber comprising:
         an exhausting chamber bottom disposed relative to the second drainage hole;
         an exhausting chamber neck having an outlet; and
         a waterproof slab disposed between the exhausting chamber neck and the second ventilation hole for separating the outlet of the exhausting chamber neck and the second ventilation hole; and
   a fan disposed inside the fan room for guiding airflow to pass through the first ventilation hole, the inhaling chamber, the fan room, the accommodated space, the exhausting chamber, and the second ventilation hole in a sequence.

2. The waterproof and heat-dissipating structure of claim 1, wherein the airflow driven by the fan flows into the inhaling chamber through the first drainage hole.

3. The waterproof and heat-dissipating structure of claim 1, wherein the air driven by the fan flows out the exhausting chamber through the second drainage hole.

4. The waterproof and heat-dissipating structure of claim 1, wherein the housing structure is composed of an upper housing and a lower housing engaging to each other closely.

5. The waterproof and heat-dissipating structure of claim 1, wherein a plurality of fake holes of the housing structure is aligned with the inhaling chamber neck and the first ventilation hole is disposed on two sides of the plurality of fake holes.

6. The waterproof and heat-dissipating structure of claim 4, wherein the inhaling chamber, the fan room, and the exhausting chamber are disposed on the upper housing and the accommodated space is disposed on the lower housing, and the inhaling chamber, the fan room, and the exhausting chamber are parallel to the accommodated space.

7. The waterproof and heat-dissipating structure of claim 1, wherein the fan room having an inlet connected to a top opening of the fan and an outlet of the inhaling chamber neck, and an outlet connected to a lateral opening of the fan and the accommodated space are formed on the fan room.

8. The waterproof and heat-dissipating structure of claim 1, wherein length of the inhaling chamber neck is related to air inhaling force from the fan room.

9. The waterproof and heat-dissipating structure of claim 1, wherein an inclined slab extended from the exhausting chamber neck is disposed surrounding an inlet of the exhausting chamber neck.

10. The waterproof and heat-dissipating structure of claim 1, wherein an inclined slab extended from the inhaling chamber neck is disposed surrounding the outlet of the inhaling chamber neck.

11. The waterproof and heat-dissipating structure of claim 9, wherein an angle between an inclined surface of the inclined slab, stretching from a side far from the exhausting chamber neck to a side connecting with the exhausting chamber neck, and the compartment structure is between 3 degrees and 30 degrees.

12. The waterproof and heat-dissipating structure of claim 9, wherein an angle between an inclined surface of the inclined slab, stretching from a side far from the inhaling chamber neck to a side connecting with the inhaling chamber neck, and the compartment structure is between 3 degrees and 30 degrees.

* * * * *